United States Patent [19]

Youmans et al.

[11] 3,913,121

[45] Oct. 14, 1975

[54] SEMICONDUCTOR STRUCTURE

[75] Inventors: Albert P. Youmans, Cupertino; David F. Allison, Los Altos; David A. Maxwell, San Jose, all of Calif.

[73] Assignee: Signetics Corporation, Sunnyvale, Calif.

[22] Filed: Jan. 27, 1970

[21] Appl. No.: 6,078

Related U.S. Application Data

[60] Division of Ser. No. 391,704, Aug. 24, 1964, Pat. No. 3,829,889, which is a continuation-in-part of Ser. No. 338,802, Jan. 20, 1964, abandoned, which is a continuation-in-part of Ser. No. 330,697, Dec. 16, 1963, abandoned.

[52] U.S. Cl. .................... 357/10; 29/580; 148/187; 156/17; 357/47

[51] Int. Cl. .............................................. B44d 1/18

[58] Field of Search ...... 29/576, 580; 117/212, 215; 148/187; 156/17; 161/37; 357/47

[56] References Cited

UNITED STATES PATENTS 3,290,753 12/1966 Chang ................................ 29/25.3

*Primary Examiner*—William A. Powell
*Assistant Examiner*—Brian J. Leitten
*Attorney, Agent, or Firm*—Flehr, Hohbach, Test, Albritton & Herbert

[57] ABSTRACT

Semiconductor structure formed of a semiconductor body formed of semiconductor material with a first layer of insulating material on a surface of the semiconductor body. A first support structure is provided on the layer of insulating material. The semiconductor body has grooves therein which extend to the layer of insulating material to provide a plurality of islands of semiconductor material formed from the semiconductor body. A second layer of insulating material is formed on the exposed surfaces of the semiconductor islands. A second support structure is provided on the second layer of insulating material whereby the first support structure may be removed and circuit devices fabricated in the isolated islands.

7 Claims, 80 Drawing Figures

INVENTORS

ALBERT P. YOUMANS
DAVID F. ALLISON
DAVID A. MAXWELL

BY Flehr, Hohbach, Test, Albritton & Herbert ATTORNEYS

INVENTORS
ALBERT P. YOUMANS
DAVID F. ALLISON
DAVID A. MAXWELL
Flehr, Hohbach, Test, Albritton & Herbert
ATTORNEYS INVENTORS
ALBERT P. YOUMANS
DAVID F. ALLISON
DAVID A. MAXWELL
BY Flehr, Hohbach, Test, Albritton & Herbert
ATTORNEYS

*INVENTORS*
ALBERT P. YOUMANS
DAVID F. ALLISON
DAVID A. MAXWELL
BY Flehr, Hohbach, Test, Albritton & Herbert
ATTORNEYS INVENTORS
ALBERT P. YOUMANS
DAVID F. ALLISON
DAVID A. MAXWELL
BY Flehr, Hohbach, Test, Albritton & Herbert
ATTORNEYS INVENTORS
ALBERT P. YOUMANS
DAVID F. ALLISON
DAVID A. MAXWELL
BY Flehr, Hohbach, Test, Albritton & Herbert
ATTORNEYS INVENTORS
ALBERT P. YOUMANS
DAVID F. ALLISON
DAVID A. MAXWELL
BY Flehr, Hohbach, Test, Albritton & Herbert
ATTORNEYS INVENTORS
ALBERT P. YOUMANS
DAVID F. ALLISON
DAVID A. MAXWELL
BY Flehr, Hohbach, Test, Albritton & Herbert
ATTORNEYS INVENTORS
ALBERT P. YOUMANS
DAVID F. ALLISON
DAVID A. MAXWELL
BY Flehr, Hohbach, Test, Albritton & Herbert
ATTORNEYS INVENTORS
ALBERT P. YOUMANS
DAVID F. ALLISON
DAVID A. MAXWELL
BY Flehr, Hohbach, Test, Albritton & Herbert
ATTORNEYS

INVENTORS

ALBERT P. YOUMANS
DAVID F. ALLISON
DAVID A. MAXWELL

BY Flehr, Hohbach, Test, Albritton & Herbert
ATTORNEYS

SEMICONDUCTOR STRUCTURE

CROSS-REFERENCES TO RELATED APPLICATIONS

This application is a division of application Ser. No. 391,704, filed on Aug. 24, 1964, now U.S. Pat. No. 3,829,889, which is a continuation-in-part of application Ser. No. 338,802, filed Jan. 20, 1964, now abandoned, which is a continuation-in-part of application Ser. No. 330,697, filed Dec. 16, 1963,now abandoned.

BACKGROUND OF THE INVENTION

This invention relates to a semiconductor structure and more particularly to isolated integrated circuitry.

At the present time, the conventional integrated circuitry is isolated by the use of p-n junctions. It has been found that p-n junctions have a number of disadvantages. One is that there is an appreciable leakage associated with such junctions particularly at elevated temperatures. Also, there is a very high capacitance per unit area associated with such junctions. Furthermore, a p-n junction has a disadvantage in that it has a high resistance in one direction only. As a result, in most integrated circuitry, the speed and performance are limited primarily not by the active elements but by the isolating p-n junctions. There is, therefore, a need for a new and improved structure in which active and passive elements in integrated circuitry are isolated from each other.

In general, it is an object of the present invention to provide a semiconductor structure having greatly improved isolation between the passive and active elements of the integrated circuitry.

Another object of the invention is to provide a semiconductor structure of the above character in which isolated islands of semiconductor material are provided in which active and passive elements can be formed.

Another object of the invention is to provide a semiconductor structure of the above character in which insulating material electrically insulates the islands from a support structure.

Another object of the invention is to provide a semiconductor structure of the above character in which the support structure can have a very high resistance.

Another object of the invention is to provide a semiconductor structure of the above character in which active and passive elements can be formed in the isolated islands by substantially conventional techniques.

Another object of the invention is to provide a semiconductor structure of the above character in which the islands have a uniform depth with surfaces lying in a common plane.

Another object of the invention is to provide a semiconductor structure of the above character in which epitaxial techniques can be utilized in the formation of the support structure and of the active and passive elements in the isolated islands.

Another object of the invention is to provide a semiconductor structure of the above character in which substantially conventional materials can be utilized.

Additional objects and features of the invention will appear from the following description in which the preferred embodiment of the invention is set forth in detail in conjunction with the accompanying drawings.

Referring to the drawings.

In general, it is an object of the present invention to provide a semiconductor structure formed of a semiconductor body in which insulating material is disposed in the body to form at least one island in the semiconductor body having an exposed surface and electrically isolated from the remainder of the body by the insulating material.

Figure 1:
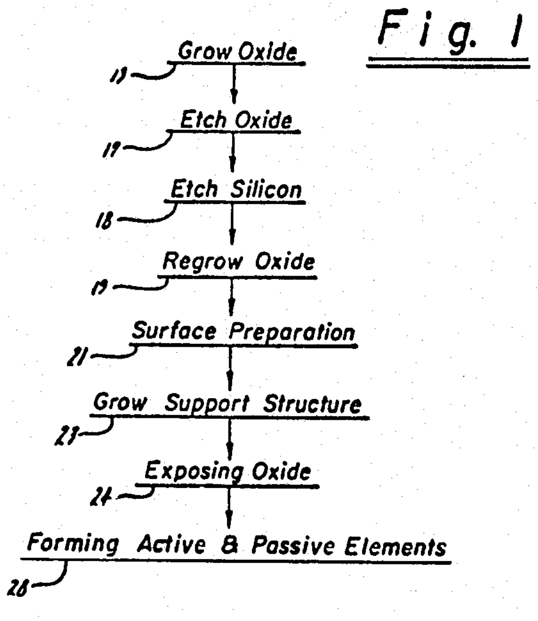
FIG. 1 is a chart showing the principal steps utilized in performing our method for forming one embodiment of our semiconductor structure.
Figure 4:
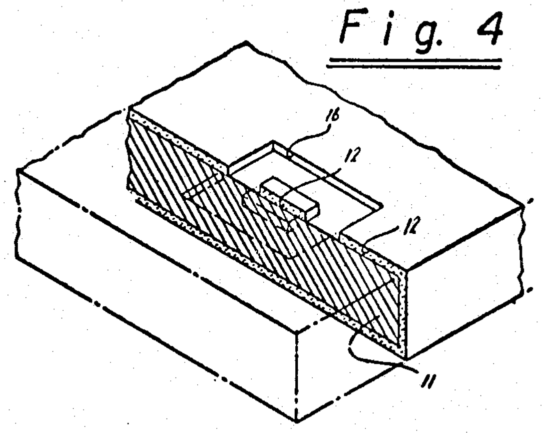
FIG. 4 is an isometric view, partially in broken lines, showing a grid pattern etched into the layer of insulating material and extending down to the monocrystalline silicon serving as the semiconductor body.
Figure 5:
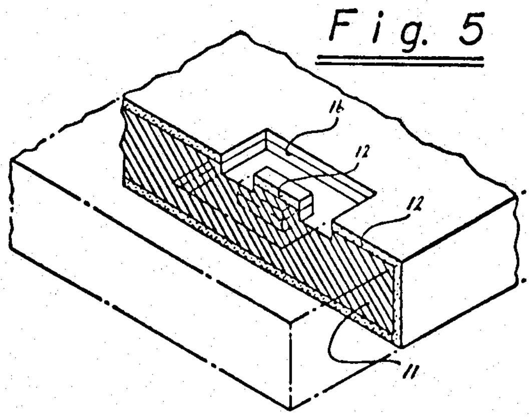
FIG. 5 is an isometric view, partially in broken lines, of the semiconductor body and insulating layer showing the grid pattern etched into the semiconductor body.
Figure 2:
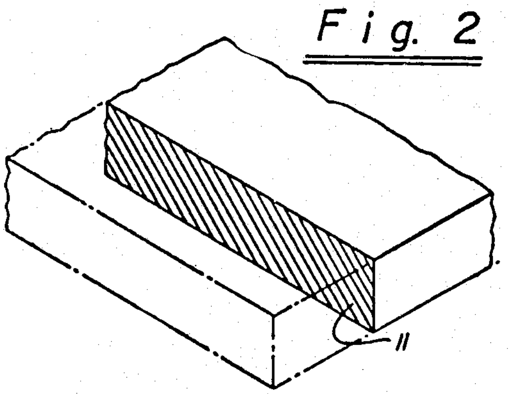
FIG. 2 is an isometric view, partially in broken lines, showing a block or slice of single crystal or monocrystalline silicon which serves as a semiconductor body and which is used in fabricating our semiconductor structure.

As shown in FIG. 2, our semiconductor structure is formed by first taking a semiconductor body 11 of a suitable type, such as a slice or wafer of single crystal or monocrystalline silicon, which also may be of either *n* or *p* type conductivity and forming thereon a layer 12 of suitable insulating material which completely encloses the monocrystalline silicon body 11. This insulating layer can be formed on the body 11 in any suitable manner well known to those skilled in the art. For example, a layer of silicon dioxide can be thermally grown on the semiconductor body 11 by placing the semiconductor body 11 in an atmosphere of oxygen and heating the semiconductor body to a relatively high temperature as, for example, 1000° to 1300° C. for a period of time which can vary from approximately ½ hour to as much as 10 hours depending upon the thickness of the insulating layer desired. This growth of the insulating layer is shown as step 13 in FIG. 1.

Thereafter, a grid pattern 16 is formed in an exposed surface of the layer of insulating material. This step, which is shown as step 15 in FIG. 1, can be performed in any suitable manner as, for example, by utilizing photolithographic techniques. With such techniques, a photoresist is applied to the layer of insulating material and is then exposed to light which hardens the photoresist. The portions of the photoresist which have not been exposed to light are removed and thereafter a suitable etch, such as a dilute solution of hydrofluoric acid, is applied to the semiconductor structure which will only attack the layer of insulating material, that is, the silicon dioxide. This etching action is continued until the etch reaches the monocrystalline silicon semiconductor body 11.

After this step has been completed, the semiconductor structure, using the oxide layer 12 as a mask, is exposed to another suitable etching solution as, for example, a mixture of hydrofluoric acid and nitric acid which preferentially attacks the silicon but not the insulating layer of silicon dioxide. This etching step 18 is continued until the grid pattern 16 penetrates the monocrystalline silicon body 11 to a controlled depth to form grooves 17 in the body 11. Normally, it is not desirable to penetrate the monocrystalline silicon body 11 any farther than necessary in order to conserve space. However, it is necessary to penetrate the monocrystalline silicon body 11 to form grooves 17 of a depth at least somewhat greater than the depth of any of the active or passive elements formed in the semiconductor structure as hereinafter described.

Figure 6:
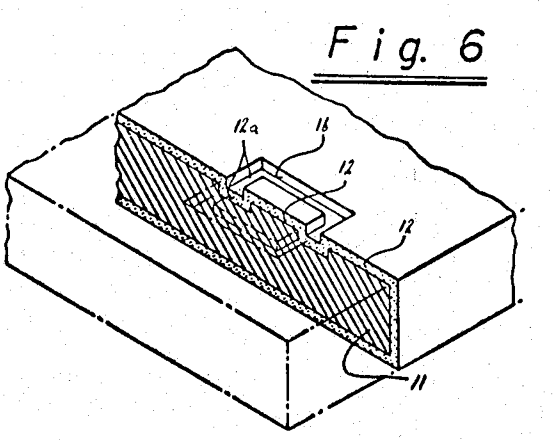
FIG. 6 is an isometric view, partially in broken lines, showing the semiconductor structure in which a layer of insulating material has been regrown in the grid pattern to form a grid structure.

In the next step 19, the insulating layer is grown in the grooves 17 by subjecting the semiconductor structure to the same oxidizing atmosphere as in the step 13, as shown particularly in FIG. 6 in which portions **12*a* of silicon dioxide are formed in the grooves 17 and are connnected to the remaining portions of the insulating layer 12 surrounding the semiconductor body 11 to provide a grid structure 20. When exposed to the oxidizing atmosphere, the layer of insulating material will be formed in the grooves 17 much more rapidly because of the exposed monocrystalline silicon within the grooves 17. A very small additional thickness will be added to the original insulating layer 12. If desired, the entire layer of insulating material 12 can be removed before the step 19 is commenced and then the inslating layer 12 can be regrown on the entire semiconductor body to provide the grid structure 20.**

Thereafter, the exposed surface of the grid structure 20 is prepared by careful cleaning as shown by step 21 so that a support structure can be grown thereon. A support structure 22 of suitable material such as polycrystalline silicon is deposited upon the grid structure 20. Other materials, and in particular insulating materials such as aluminum oxide ($Al_2O_3$) and silicon dioxide ($SiO_2$) can also be used for the support structure. This support structure or layer 22 is deposited to the desired depth in step 23 as, for example, a depth from 100–200 microns. Although polycrystalline silicon has been shown as being grown upon the insulating layer, other materials such as silicon dioxide can be deposited upon the layer to provide a suitable support structure.

Figure 8:
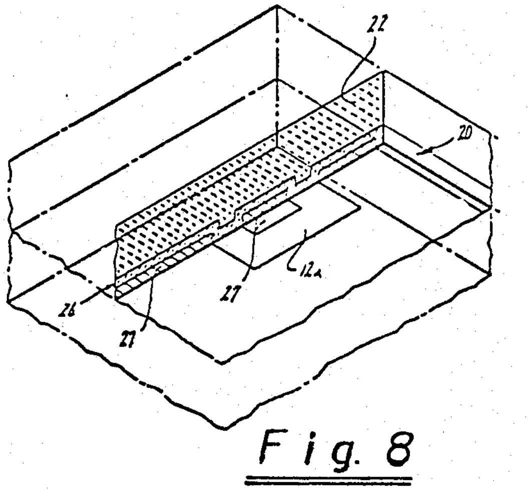
FIG. 8 is an isometric view, partially in broken lines, of the semiconductor structure in which the lower portion of the semiconductor structure has been cut away or removed to expose the grid structure and to expose surfaces of islands embedded within and electrically isolated from each other by the grid structure.

In the next step 24, portions of the grid structure 20 of the insulating material are exposed in a suitable manner such as by lapping or etching to remove the bottom portion of the semiconductor structure as shown in FIG. 8. The grid structure 20, when portions are exposed as explained above, forms islands 27 of monocrystalline silicon embedded in the supporting grid structure and which are electrically isolated from each other by the grid structure 20 which is formed of a good insulating material.

Thereafter, as shown by step 28, active and passive elements can be formed in the islands 27 by the use of substantially conventional masking and diffusion techniques well known to those skilled in the art. For example, the exposed surfaces of the islands 27 can be oxidized to provide a layer of insulating material overlying the same. Thereafter, by photolithographic masking techniques, windows are opened in these surfaces and appropirate impurities are diffused into the monocrystalline silicon to convert the monocrystalline silicon to an n-type or p-type silicon as desired if it is not already of this type. Subsequently, an oxide is regrown over these monocrystalline surfaces and windows are again formed for the purpose of making contact to the various *n* and *p*-type areas. Commonly used techniques to provide contacts for interconnecting the active and passive elements are utilized. This is done by evaporating metal over the surface and then utilizing photomasking techniques to remove the metal where it is not desired. A completed structure is shown in FIG. 9 in which active elements such as diodes 31 and transistors 32 and passive elements such as thin film resistor 33 have been formed in the islands and interconnected by evaporated metal leads 34.

Figure 9:
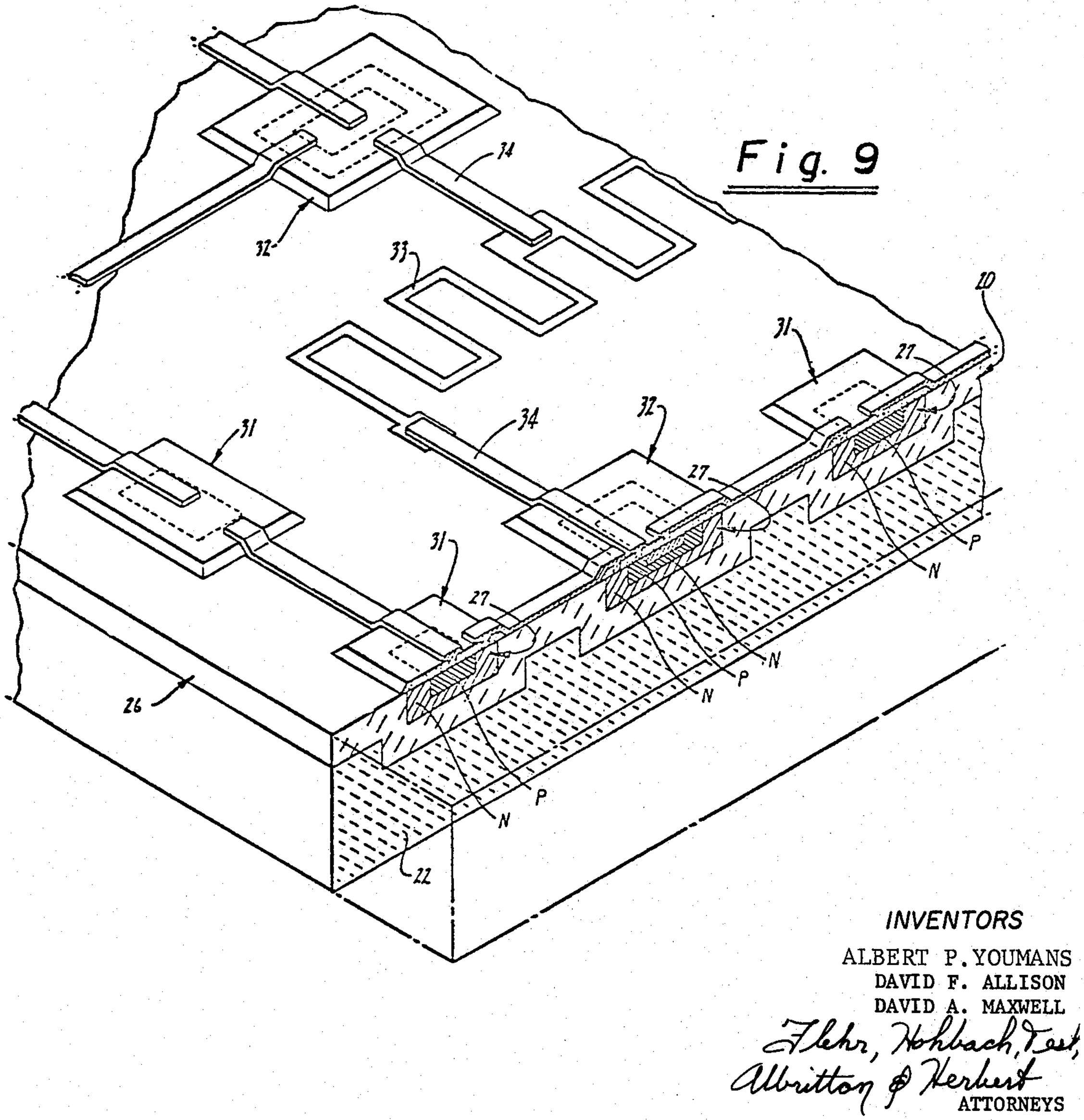
FIG. 9 is an isometric view, partially in broken lines, of semiconductor structures in which active and passive elements have been formed in the islands and are interconnected to provide integrated circuitry in which the active and passive elements are isolated from each other by the grid structure.

In the semiconductor structure shown in FIG. 9, the polycrystalline silicon which forms the body 22 serves primarily as a support structure for the remainder of the semiconductor structure. As pointed out above, other materials can be utilized for the support structure. However, it is desirable that these materials have the proper adherence qualities and have a coefficient of expansion which is similar to the coefficient of expansion of silicon dioxide. In addition, they should have the very desirable attribute that the entire structure can be subjected to elevated temperatures without breaking or other adverse effects. The use of polycrystalline silicon as a support structure makes this possible.

We have found by the use of this method to form our semiconductor structure we have been able to provide active and passive elements which are electrically isolated from each other by a relatively high resistance. This semiconductor structure and method makes it possible to form integrated circuitry which peforms in a manner equivalent to circuitry which is comprised of discrete components because of the extreme isolation between active and passive components that can be attained. This extreme isolation is made possible because silicon dioxide is a very good insulator. In addition, it has a relatively low dielectric constant and can be made quite thick, if desired, so that capacitances can be reduced to very small amounts. For these reasons, it is possible to greatly reduce parasitic capacitances and leakages within the integrated circuitry.

Our semiconductor structure has the additional advantage in that when polycrystalline silicon is used for the support structure, it can be made with a very, very high resistance and, therefore, the capacitance associated with the silicon dioxide is effectively put in series with a very high resistance which also helps to reduce the so-called effective capacitance of the silicon dioxide at high frequencies. Also, because silicon dioxide is such a good insulator, it will not break down unless very high voltages as, for example, in the order of 1000 volts, are applied to it. In addition, our semiconductor structure overcomes leakage because the resistivity of silicon dioxide is very, very high. Our semiconductor structure also has the advantage in that it can be utilized at very high temperatures without appreciably affecting its performance. In addition, our semiconductor technique permits structures to be formed that are similar to structures obtained with epitaxial techniques. Thus, for example, before the oxide layer is grown as shown by the initial step 13, an n-type or p-type layer can be formed on the upper surface of the semiconductor body 11. When this is done, we end up with a layer of the p-type or n-type material which is disposed in the bottom of the islands 27 adjacent the oxide layer. Such a layer as, for example, in a transistor, can be utilized for reducing the series collector resistance of the transistor. This is because it permits the current to flow from the emitter directly through this heavily doped layer and then back out again over small distances which generally reduces the collector resistance by a factor of 2 or more.

In the formation of transistors in the islands 27, it is relatively important that the depth of the islands 27 be rather precisely controlled. As is well known to those skilled in the art, transistor parameters and particularly the saturation resistance of a transistor is affected by the depth of the single crystal silicon layer or island in which the transistor is formed. Therefore, in addition to isolating the islands 27, it is important that the islands 27 have a uniform depth as, for example, a depth of 10 microns. It is because such depth is relatively small in comparison to the total thickness of the structure that this uniformity in thickness may be difficult to achieve.

Figure 7:
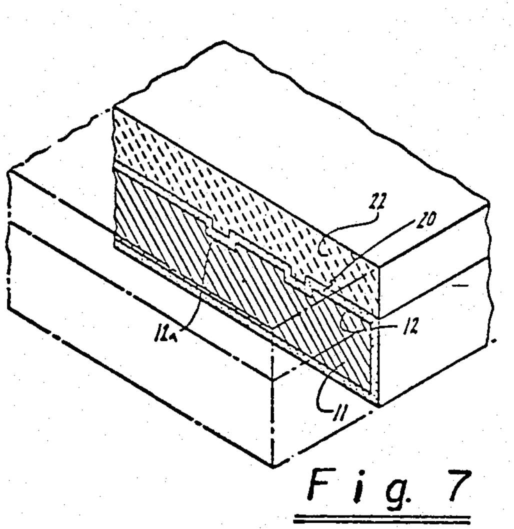
FIG. 7 is an isometric view, partially in broken lines, showing the semiconductor structure with a support structure deposited on the grid structure.
Figures 10, 11, 12, 13, 14:
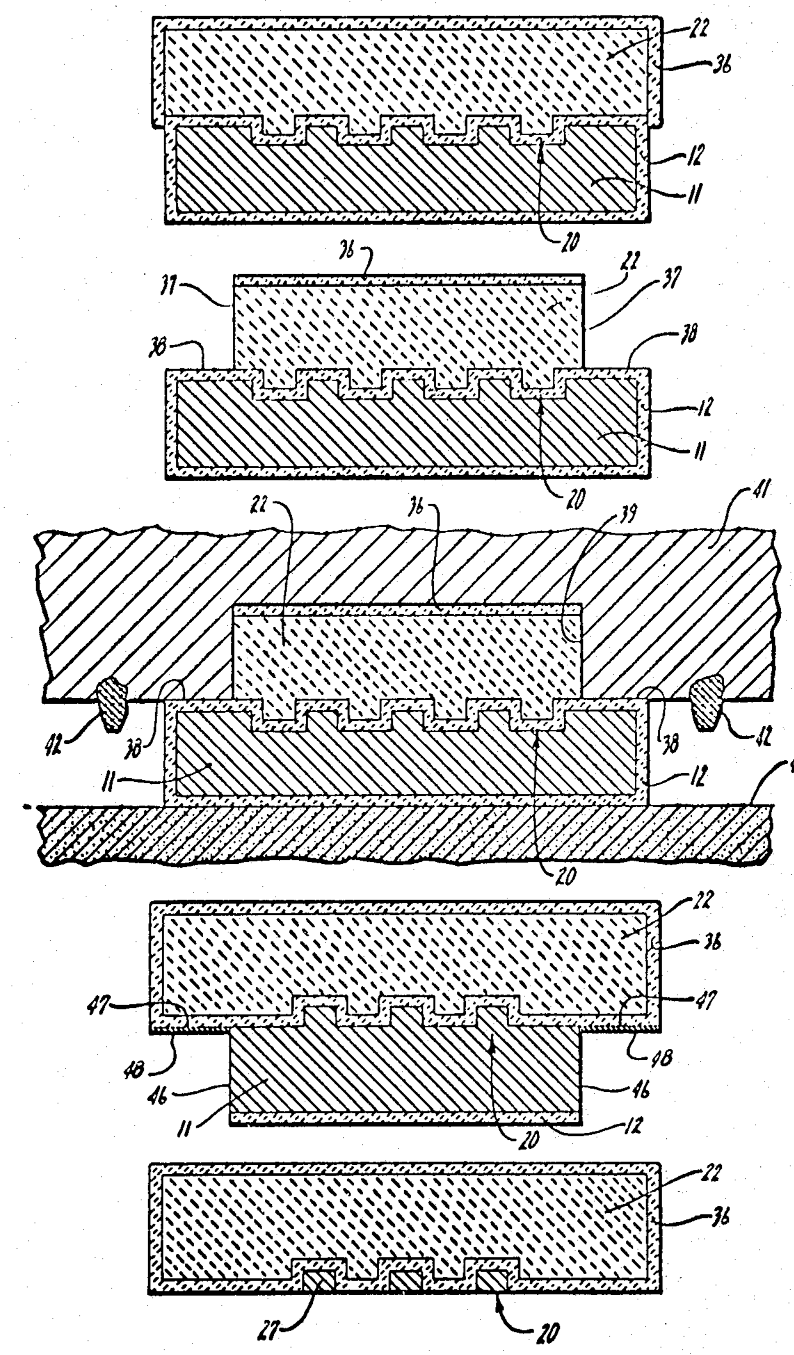
FIGS. 10–12 are cross-sectional views of semiconductor structures showing a method by which a uniform controlled depth is obtained for the isolated islands by the use of mechanical stops in a lapping machine.
FIGS. 13–14 are cross-sectional views of semiconductor structures showing a method by which islands with a controlled uniform depth can be obtained by the use of stops formed in the semiconductor structure after formation of the support structure.

In FIGS. 10–12, we have shown a method by which the depth of the islands can be made with a uniform controlled thickness utilizing mechanical means. Starting with a semiconductor structure such as that shown in FIG. 7 in which a grid structure 20 is disposed between a support structure 22 and a body 11 of semiconductor material, a mask 36 is applied to the support structure 22. For example, the entire semiconductor structure can be placed in an oxidizing atmosphere so that a layer of silicon dioxide is deposited on the outer surface of the support structure 22 to provide the mask 36. Thereafter, by photolithiographic masking techniques, the outer portions of the mask 36 are exposed and are then etched away by suitable etch. Thereafter, the remaining silicon dioxide is used as a mask and the outer extremities of the support body 22 are removed by a suitable etch which selectively attacks the polycrystalline supoort structure and removes the same down to the grid structure 20 to provide recesses 37 and lips 38 on opposite sides of the support body 22. The etching is stopped because the etch selectively attacks the polycrystalline and will not attack the silicon dioxide.

After the semiconductor structure has been completed to the extent shown in FIG. 11, the semiconductor structure is placed in a lapping machine in which the support structure 22 is disposed in a recess 39 provided in the support plate 41 of the lapping machine. The lips 38 engage the lower face of the support plate as shown in FIG. 12. Diamond points 42 are positioned in the support plate using the lips 38 as reference surfaces in a manner well known to those skilled in the art. The points 42 serve as accurate gauges for making the islands 27 of the desired depth.

In positioning the diamond points 42, it is necessary to take into account the thickness of the insulating layer 12 which may be in the order of ½ micron. After the diamond points have been positioned, the lower portion of the insulating layer 12 and the lower portion of the semiconductor body 11 can be removed by the use of the lapping plate 43. Lapping will continue until the lapping plate engages the diamond points 42 to stop the lapping operation at the precise depth desired for the islands. As hereinafter explained, if necessary, the lapping operation can actually continue through the lower extremities of the grid structure 20 without any disadvantageous effects. If a certain amount of the lower portion of the grid structure is removed, it can be readily regrown by placing the semiconductor structure in an oxidizing atmosphere.

Another method for providing islands 27 of a uniform controlled depth is shown in FIGS. 13 and 14 which incorporates the formation of a stop in the semiconductor structure itself. Starting with the structure which is shown in FIG. 10, photolithographic masking techniques again are utilized in conjunction with an etch to remove the outer extremities of the insulating layer 12. Thereafter, another etch is utilized to selectively etch away the semiconductor body 11 down to the grid structure 20 to provide recesses 46 and lips 47 on opposite sides of the semiconductor body 11. A relatively shallow layer 48 of a suitable material which is harder than the insulating layer 12 and the semiconductor body 11 is deposited on the ledges or lips 47. One material found to be suitable is chrome. For example, on Mohs scale, chrome has a hardness of 9, whereas silicon dioxide and silicon have a hardness of 7. Thereafter, the support structure 22 of the semiconductor body is again placed in the recess 39 of the support plate of the lapping machine. A lapping compound is then used which is harder than silicon and silicon dioxide but which is less hard than chrome. The insulating layer 12 and a substantial portion of the semiconductor body 11 are removed. Lapping continues until the lapping plate 43 reaches the chrome layers 48. The lapping operation will be stopped by the chrome because the lapping compound is less hard than the chrome. In this way, the layers 48 provide a precise stop so that the islands 27 will have a precise uniform controlled depth as shown in FIG. 14.

From the foregoing, it can be seen that we have provided means for forming the isolated islands 27 so that they have a precise uniform depth. It is not absolutely necessary that each island have the same or uniform depth because, if desired, islands of different depths can be formed merely by the use of additional steps. At the same time, it is possible to obtain a very planar surface which is particularly desirable in the formation of high quality integrated circuitry. With the semiconductor structure shown in FIG. 14, the chrome can be readily removed by suitable etch. Thereafter, the oxide layer can be formed over the isolated islands 27 by placing the same in an oxidizing atmosphere as hereinafter explained.

In the method shown in FIGS. 13 and 14, the stops formed in the semiconductor structure are formed after the support structure has been formed. Alternatively, if desired, the stops can be incorporated in the semiconductor structure before the support structure is formed as shown in FIGS. 15–18. Starting with the semiconductor structure which is shwon in FIG. 3, selected portions of the insulating layer 12 are etched away in a manner hereinbefore described. Thereafter, grooves 17 are etched into the semiconductor body 11 and, in addition, lips or ledges 51 are formed on opposite extremities of the semiconductor structure. Thereafter, a layer 52 of relatively hard material such as chrome is deposited on the lips 51 to serve as the stop. The grid structure 20 is thereafter completed by exposing the body in an oxidizing atmosphere as hereinbefore described.

Figures 15, 16, 17, 18, 19, 20, 21, 22, 23, 24:
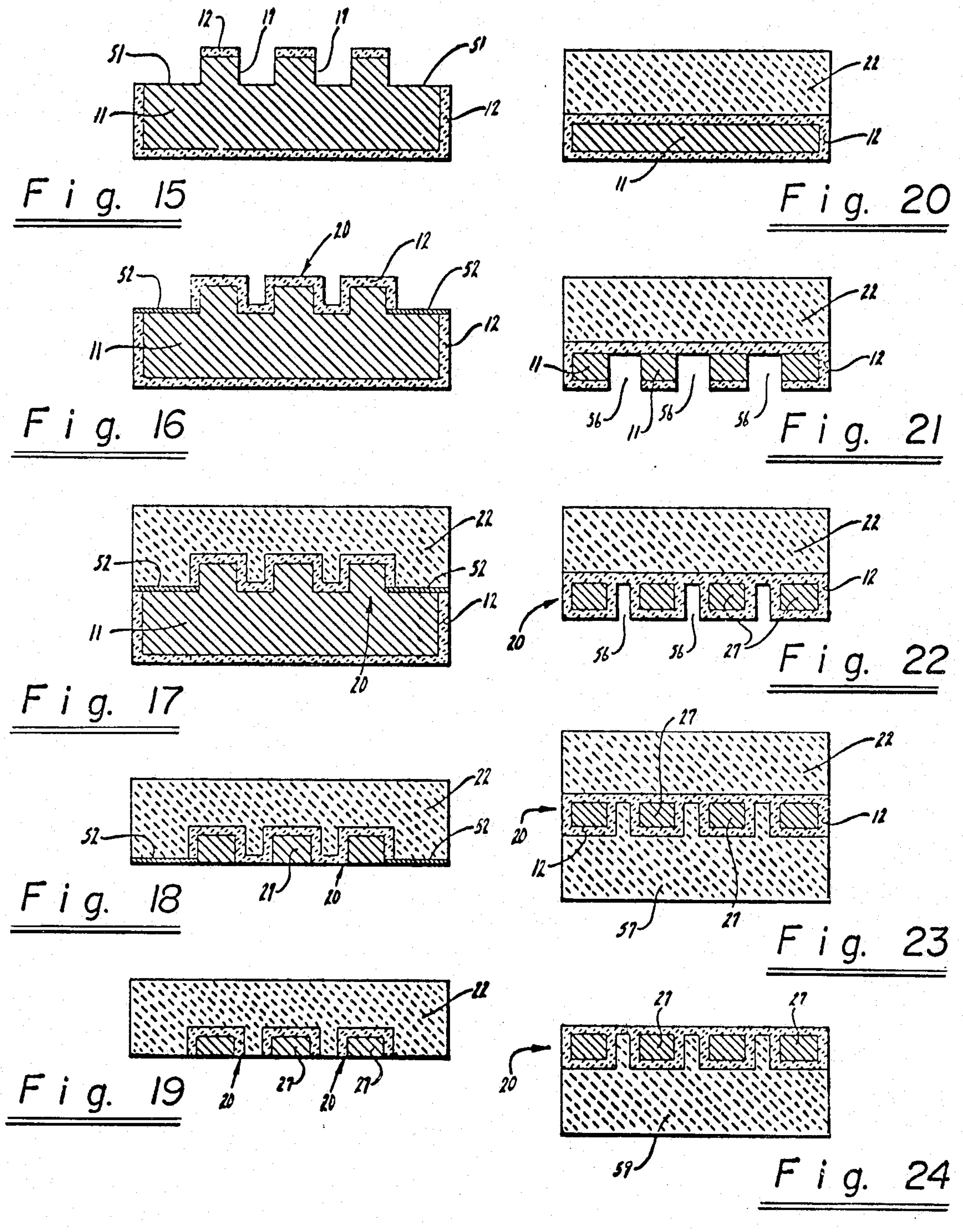
FIGS. 15–18 are cross-sectional views of semiconductor structures showing the steps by which a uniform controlled depth is obtained for the isolated islands by the use of stops formed in the semiconductor structure before formation of the support structure.
FIG. 19 is a cross-sectional view of a semiconductor structure showing a method for obtaining a controlled uniform depth for the isolated islands by utilization of a support structure formed of a relatively hard material.
FIGS. 20–24 are cross-sectional views of semiconductor structures showing a method in which two separate support structures are formed and in which the first support structure is removed to provide a planar surface.

The support structure 22 is then grown upon the grid structure 20 as shown in FIG. 17. After this has been completed, the entire semiconductor structure can be placed in the lapping machine and the lower extremity of the semiconductor structure removed up to a level at which the lapping plate engages the chrome stops 52 to halt the removal of the semiconductor body to thereby provide islands 27 of the desired uniform controlled depth. Thereafter, the chrome stops 52 can be removed and the semiconductor structure placed in an oxidizing atmosphere to form an insulating layer over the islands to thereafter permit the formation of active and passive devices as hereinbefore described.

Alternatively, in place of the separate stops of a harder material provided in a semiconductor structure, the support structure itself can be formed of a relatively hard material to serve as such a stop as shown in FIG. 19. For example, a material such as aluminum oxide ($Al_2O_3$), Carborundum or other material can be deposited upon the grid structure 20 in place of the polycrystalline silicon. The lapping compound utilized is hard enough to lap to the silicon dioxide and the silicon but which would not attack the harder material utilized for the support structure. When such a structure and method is used, the lapping will continue until the harder material utilized for the support structure is reached. For this reason, the lower extremities of the grid structure will also be removed. This is not objectionable because an insulating layer can be readily deposited over the islands 27 and over the support structure 22 by conventional techniques.

Figure 3:
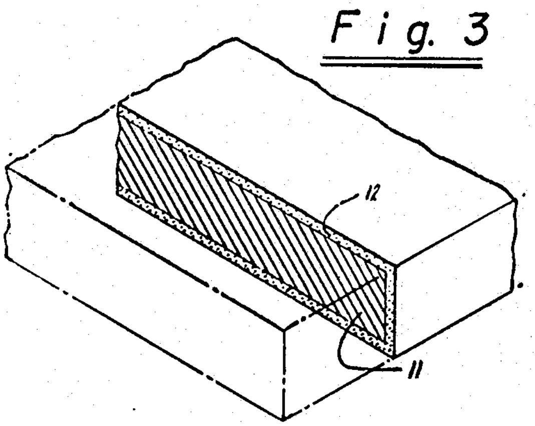
FIG. 3 is an isometric view, partially in broken lines, of the slice or block shown in FIG. 1 with a layer of insulating material grown on the same.

When it is particularly desirable to achieve a planar surface of high quality in which the active and passive elements can be formed, a method such as shown in FIGS. 20–24 can be utilized. As shown in these figures, starting with a structure such as shown in FIG. 3, a support structure 22 is grown on the insulating layer 12 and is formed of a suitable material such as polycrystalline silicon. Thereafter, by conventional photolithographic techniques, a grid pattern is formed in the lower surface of the insulating layer 12. By utilizing a suitable etch, the exposed silicon dioxide forming the insulating layer 12 is etched away. Thereafter, an etch which selectively attacks the silicon body 11 is utilized so that troughs 56 are formed which extend up to the insulating layer 12 on the other side of the semiconductor body 11. The troughs form islands 27 of the semiconductor material. Thereafter, the islands 27 are exposed to an oxidizing atmosphere of the type hereinbefore described so that an insulating layer is formed in the troughs 56 to complete a grid structure 20 in which islands 27 are completely isolated from each other by the grid structure as shown in FIG. 22.

After the grid structure has been formed, material is deposited in the troughs 56 to a substanial depth to provide a second support body 57 as shown in FIG. 23. Thereafter, the first support structure 22 is removed in a suitable manner by a suitable selective etch such as a mixture of hydrofluoric and nitric acid which selectively attacks the polycrystalline silicon and does not attack the silicon dioxide. The grid structure 20 serves as a stop for the etch to provide a completely planar surface which is formed by the upper surface of the grid structure 20. Windows can be formed in the structure 20, and active and passive devices can be formed in the islands 27 in a manner similar to that hereinbefore described. The formation of the semiconductor structure shown in FIG. 24 in this manner is particularly advantageous because it is easier to obtain a planar surface overlying the islands 27 and through which the diffused active and passive devices can be formed.

Figure 25:
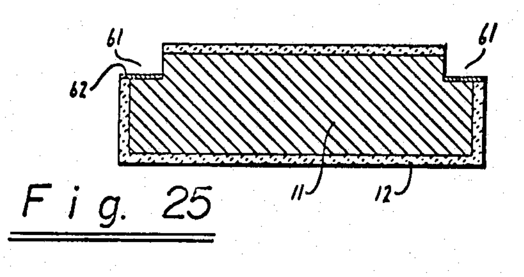
FIGS. 25–31 are also cross-sectional views of semiconductor structures and show a method similar to that shown in FIGS. 20–24 with the exception that stops are formed within the semiconductor structure to facilitate the providing of islands having a controlled uniform depth.
Figure 31:
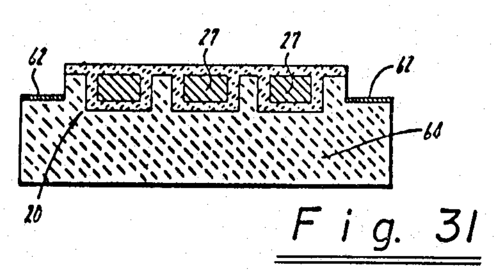

In FIGS. 25–31, we have shown a method for forming a semiconductor structure in which the islands have a controlled uniform depth. Starting from a structure such as shown in FIG. 3, recesses 61 are etched into the outer insulating layer 12 and into the semiconductor body 11 as shown in FIG. 25 to the desired depth of the islands as, for example, a depth of 10 microns. Layers 62 of a suitable hard material such as chrome are deposited on the bottoms of the recesses 61 to serve as stops. The chrome will be relatively thin as, for example, ½ micron in depth. To compensate for this thickness of the chrome, the channels 61 should be made deep enough to accommodate the layers.

Figure 26:
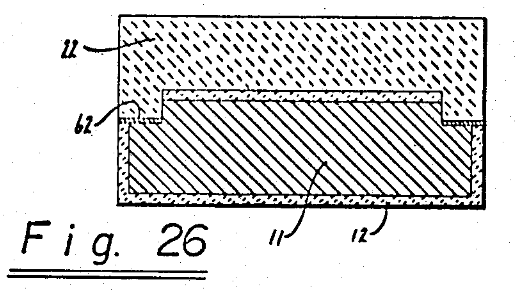
Figure 32:
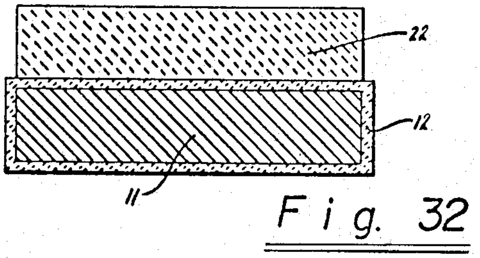
FIGS. 32–36 are cross-sectional views of semiconductor structures and show a method in which the depth of the islands is controlled by use of mechanical stops.
Figure 27:
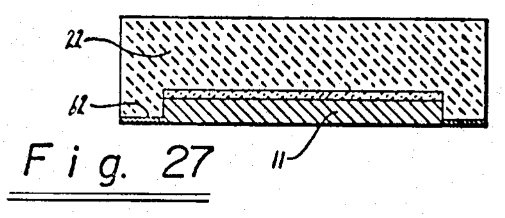

Thereafter, a support structure 22 is deposited upon the upper surface of the insulating layer 12 and the channels 61 to provide a support structure as shown in FIG. 26. Thereafter, the semiconductor structure is placed in the lapping machine and the lower portions of the insulating layer 12 and the semiconductor body 11 are removed until it has been lapped back to the chrome stops 62. This will leave a semiconductor body 11 having the desired depth as, for example, 10 microns as shown in FIG. 27. The lapped surface of the body 11 is chemically etch polished to provide a smooth surface. An oxide layer is then grown on this smooth surface. This oxide is then used as a mask to etch out channels 63 in the semiconductor body 11 to provide islands 27 of the semiconductor material.

Figure 29:
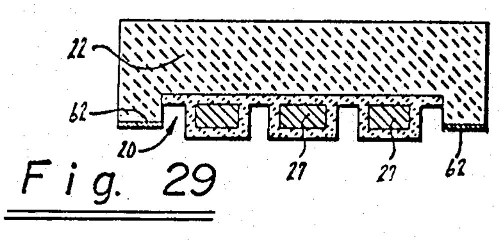
Figure 30:
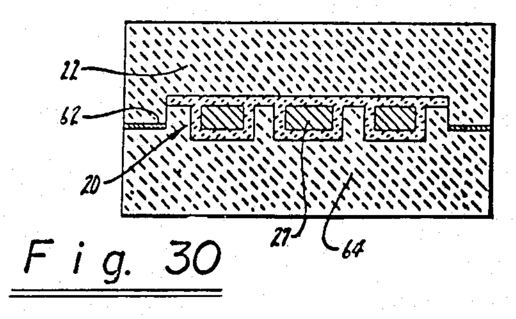

The semiconductor structure is then exposed to an oxidizing atmosphere to provide a grid structure 20 formed of silicon dioxide which isolates the islands 27 from each other as shown in FIG. 29. A second support structure 64 of suitable material such as polycrystalline silicon is then deposited upon the grid structure 20 as shown in FIG. 30. The first support structure 22 is then removed by a suitable etch to again provide a planar surface which is formed by the grid structure 20. The islands 27 are completely isolated from each other by the grid structure 20 and have a precisely controlled uniform depth with their outer surfaces lying in a common plane.

Figure 33:
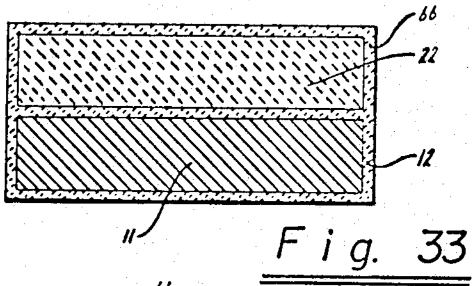
Figure 28:
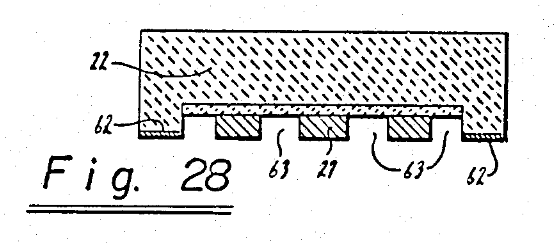
Figure 34:
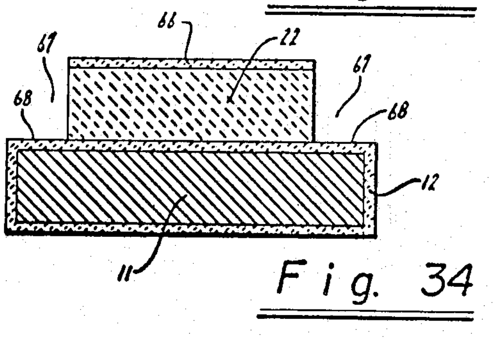
Figure 35:
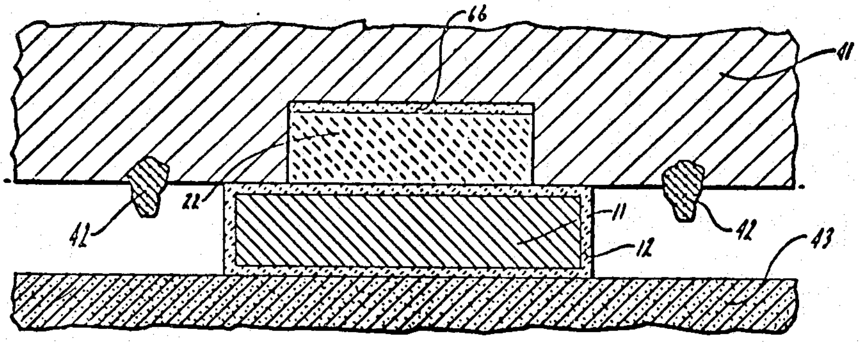
Figure 36:
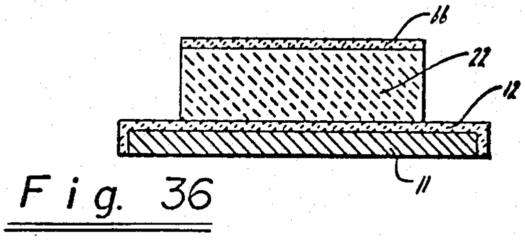
Figure 41:
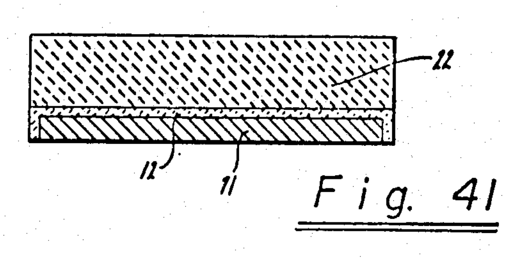
FIGS. 37–44 are cross-sectional views of semiconductor structures and show a method in which the thickness of the island is controlled by chemical etching and in which the grid structure is formed after the support structure has been provided.
Figure 37:
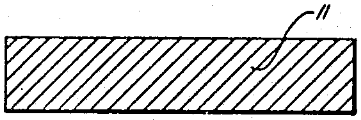
Figure 42:
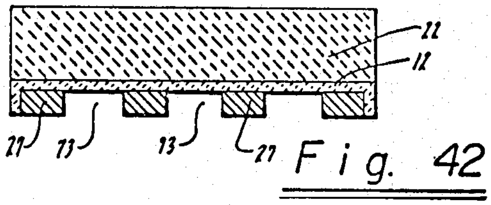
Figure 38:
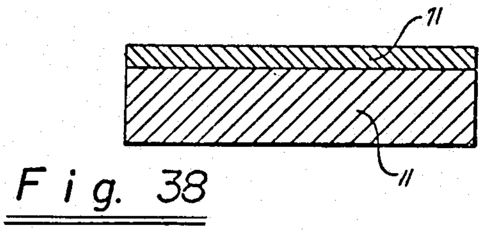
Figure 43:
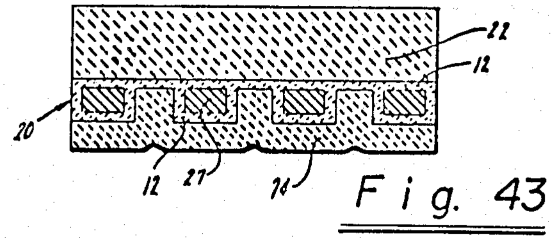

In FIGS. 32–36, we have shown another method for forming our semiconductor structure. Starting with the structure shown in FIG. 3, a support structure 22 is deposited upon the upper surface of the insulating layer 12 as shown in FIG. 33. Thereafter, recesses 67 are formed on opposite sides of the support structure 22 by etching away the outer extremities of the silicon dioxide layer 66 and the outer portions of the support structure 22 down to the insulating layer 12 surrounding the semiconductor body 11 to provide lips 68. The semiconductor structure is then placed in a lapping machine as shown in FIG. 35 with the lips 68 engaging the bottom surface of the support plate 41. The diamond points 42 are adjusted so that the desired thickness of the semiconductor body will be attained as, for example, 10 microns. The lower portions of the insulating layer 12 and the semiconductor body 11 are lapped away until the diamond points 42 are engaged to provide a semiconductor structure such as that shown in FIG. 36. It can be seen that this structure is similar to that shown in FIG. 27. Thereafter, the steps which are shown in FIGS. 28, 29, 30 and 31 are used to provide a semiconductor structure which has a planar surface and in which the islands are isolated from each other and have a uniform controlled depth.

In FIGS. 37–44, we have shown a method for forming a semiconductor structure in which the depth is controlled by electrochemical etching techniques. First, we start with a semiconductor body 11 such as a polished silicon slice and which can have impurities of either the p-type or n-type in the same. Assuming that p-type impurities are disposed in a semiconductor body, a layer 71 of controlled thickness is deposited upon the semiconductor body by suitable epitaxial or diffusion techniques. This layer is preferably of the opposite type as, for example, of n-type which has a controlled uniform thickness. The semiconductor body 11 is chosen so that the layer 71 is a semiconductor material of the desired type.

Figure 39:
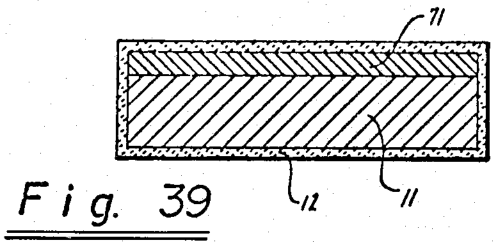
Figure 40:
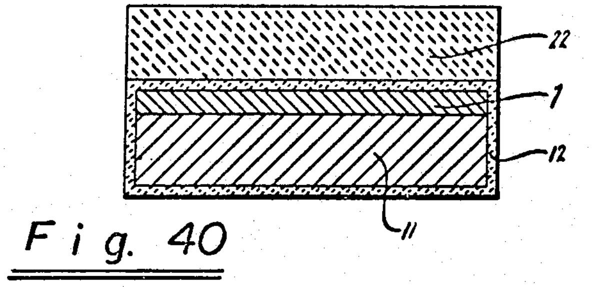

The semiconductor body with the thin layer 71 is oxidized to provide an insulating layer 12 which surrounds the same as shown in FIG. 39. A thick support structure 22 of suitable material such as polycrystalline silicon is then deposited upon the upper surface of the insulating layer 12 as shown in FIG. 40. Then, by electrochemical etching techniques well known to those skilled in the art and such as described in the article entitled "Selective Electrolytic Etching of Germanium and Silicon Junction Transistor Structures" I. S. Lesh and R. E. Gonzalez in the August 1958 issue of the Journal of the Electrochemical Society, pages 469–472, and in the article entitled "On the Jet Etching of N-type SI" by Paul F. Schmidt and David A. Keiper appearing in the July 1959 issue of the Journal of the Electrochemical Society, pages 592–596. The etching operation removes the lower portion of the insulating layer 12 and the entire semiconductor body 11 so that only the thin layer 71 remains. The etching operation stops when the junction between the layer 71 and the semiconductor body is reached because one is of the n-type and the other is of the p-type.

Figure 44:
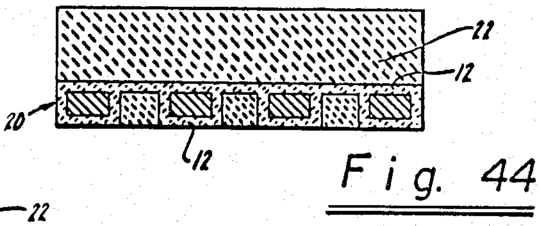

It can be seen that we have a layer 71 that has a controlled uniform thickness which can be readily used for forming islands of the type hereinbefore described. Troughs 73 are etched into the semiconductor material 71 to provide islands 27 similar to those hereinbefore described. The insulating layer 12 serves as a stop for the etch. Thereafter, the islands 27 are exposed to an oxidizing atmosphere so that a grid structure 20 of a type similar to that hereinbefore described is formed which completely isolates the islands 27 from each other and from the support structure. Thereafter, a layer 74 of suitable material such as polycrystalline silicon is deposited in the recesses 73 to fill the same. As shown in FIG. 44, the undesired portion of the layer 74 can be removed by suitable etching techniques to provide a planar structure which can be utilized for the formation of active and passive devices as hereinbefore described. Alternatively, the support structure 22 can be removed to provide the planar structure.

Figure 45:
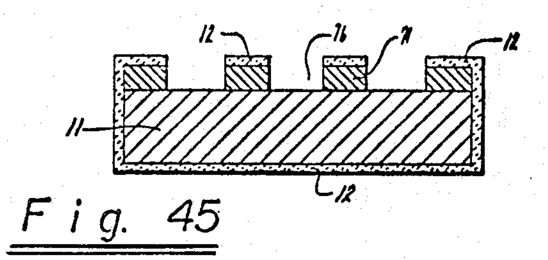
FIGS. 45–48 are cross-sectional views of semiconductor structures and show a method for controlling the depth of the isolated islands by chemical etching and in which the grid structure is formed prior to the time that the support structure is formed.
Figure 46:
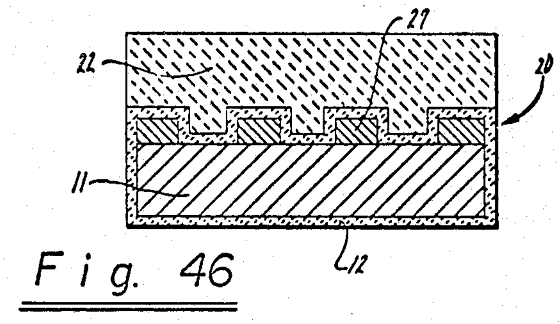
Figure 47:
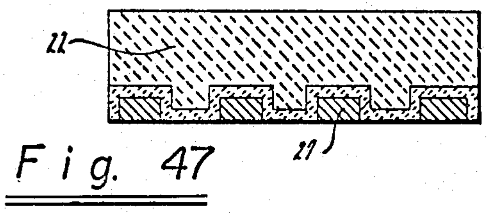
Figure 48:
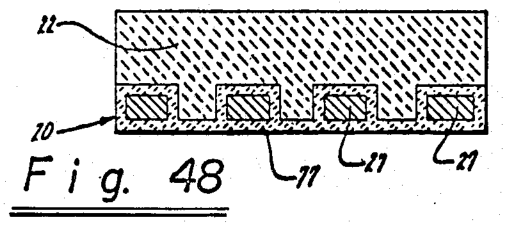

In the method shown in FIGS. 37–44, the grid pattern is formed after the support structure. In FIGS. 45–48, we have shown a method wherein the grid pattern is formed before the support structure is formed. Thus, starting with the semiconductor structure which is shown in FIG. 39, electrochemical etching techniques are utilized to form troughs 76 in the n-type layer 71 as shown in FIG. 45. The semiconductor body is then exposed to an oxidizing atmosphere to form oxide insulating layers in the troughs 76 to thereby provide a continuous insulating layer over the islands 27 as shown in FIG. 46 which forms the grid structure 20. A support structure 22 is then deposited upon the grid structure 20 as also shown in FIG. 46. Thereafter, by suitable techniques, the insulating layer 12 and the semiconductor body 11 are removed to expose the islands 27 within the insulating layers 76. Thereafter, a layer 27 of insulating material is deposited over the islands as shown in FIG. 48 to provide a substantially planar surface. Devices can then be formed in the islands as hereinbefore described. In this embodiment, it can be seen that the islands 27 also have a uniform controlled depth.

Figure 49:
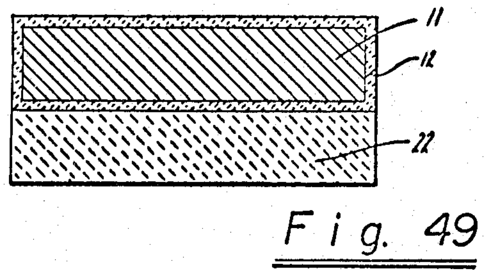
FIGS. 49–53 are cross-sectional views of semiconductor structures showing a method for forming the grid structure and in which diffused isolation fences are utilized as a part of the grid structure.
Figure 50:
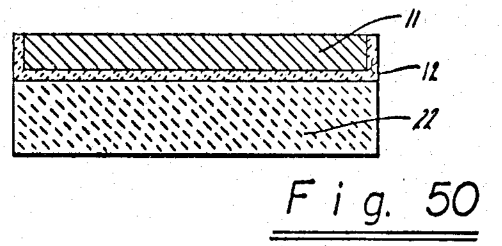
Figure 51:
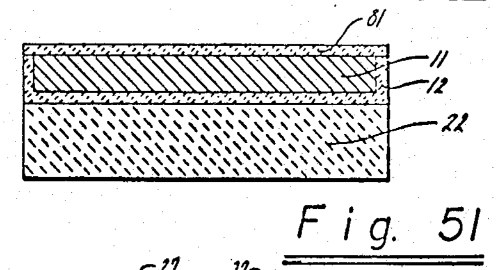
Figure 52:
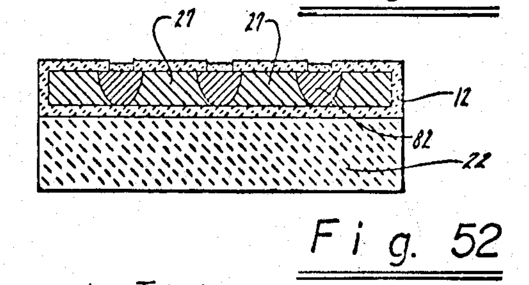
Figure 53:
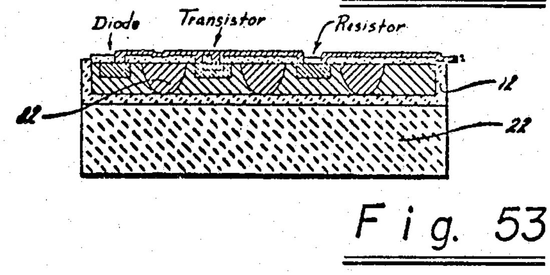

In FIGS. 49–53, we have shown still another embodiment of our semiconductor structure. Starting with the semiconductor structure shown in FIG. 3, a support structure 22 is deposited upon the lower surface of the insulating layer 12, as shown in FIG. 49. Thereafter, the upper portions of the insulating layer 12 and the semiconductor body 11 are removed by suitable techniques of the type hereinbefore described to provide a body 11 of a desired uniform depth. The semiconductor body is then placed in an oxidizing atmosphere and an insulating layer 81 is deposited over the semiconductor body 11. Thereafter, windows are formed in the insulating layer 81 and isolation fences 82 are diffused through the openings in the layer 81. The fences 82 extend down and join the insulating layer 12, as shown in FIG. 52, to thereby effectively form islands 27 which are isolated from each other by the insulating layer 12 and the diffused fences 82. Thereafter, the oxide is regrown as shown in FIG. 3, and active and passive devices are diffused through the layer 81 as shown in FIG. 53. From the foregoing, it can be seen that the insulating layer 12 and the diffused fences 82 actually form a grid structure 20 which is similar to those hereinbefore described.

Figure 54:
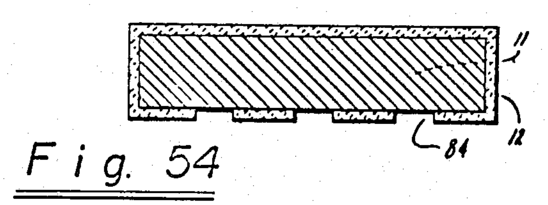
FIGS. 54–59 are cross-sectional views of semiconductor structures and show a method for forming a different type of grid structure.
Figure 58:
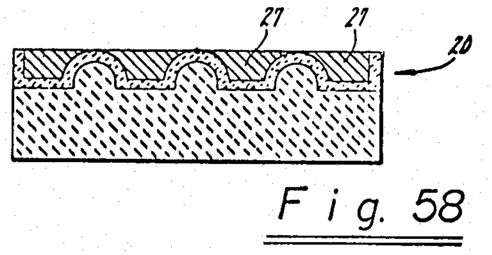
Figure 55:
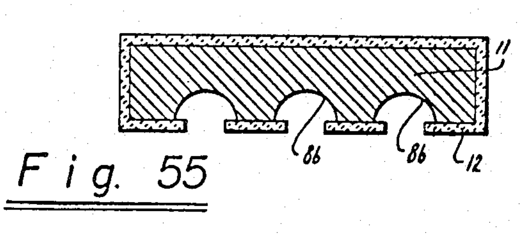
Figure 59:
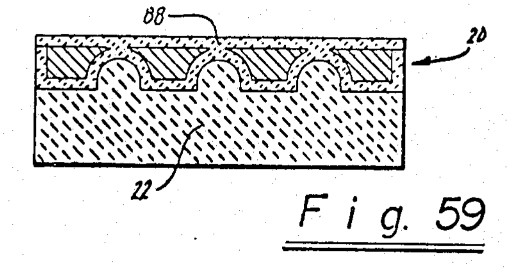
Figure 56:
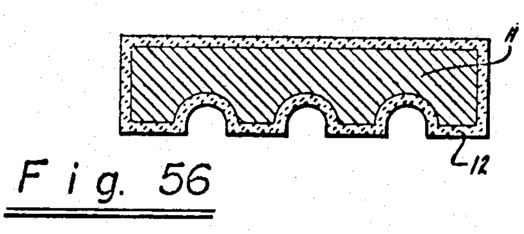

Still another embodiment of our semiconductor structure is shown in FIGs. 54–58. Starting with the semiconductor structure shown in FIG. 2, openings 84 are etched in the lower portion of the insulating layer 12 as shown in FIG. 54. Then, utilizing the silicon dioxide insulating layer 12 as a mask, the semiconductor body 11 is etched to a suitable depth as, for example, 10–40 microns to provide troughs 86. The troughs 86 are then exposed to an oxidizing atmosphere to form an insulating layer 12 which is regrown in the troughs as shown particularly in FIG. 56. A polycrystalline support structure 22 is then deposited on the lower surface of the insulating layer 12 and in the troughs 86. Thereafter, the upper portions of the insulating layer 12 and the semiconductor body are removed by suitable means such as lapping or etching until the upper portions of the insulating layer formed in the troughs are exposed as shown in FIG. 58. In this way, islands 27 are provided which are isolated by the insulating layers in the troughs. Thus, again, it can be seen that the insulating layer 12 with the insulating portions formed in the troughs forms a grid structure 20 which again serves to isolate the islands 27 from each other. Thereafter, a layer 88 of insulating material is formed over the islands so that the formation of active and passive devices in the islands can take place as hereinbefore described.

Figure 60:
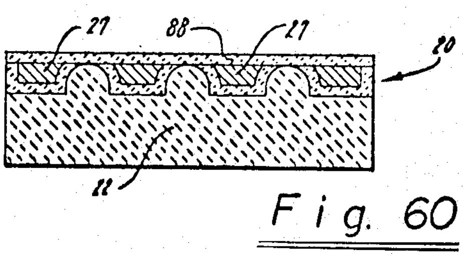
FIGS. 60 and 61 are cross-sectional views of semiconductor structures and show a modification of the grid structure formed in FIGS. 54–59.
Figure 57:
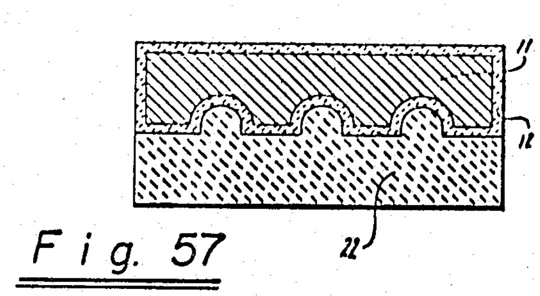
Figure 61:
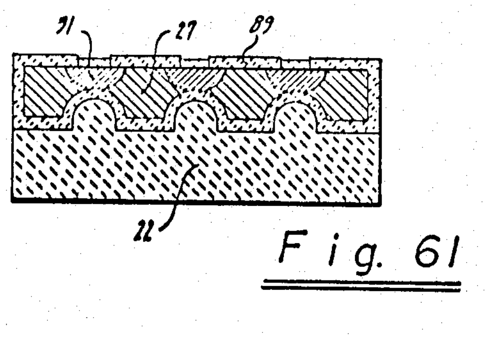

In describing the embodiment shown in FIGS. 54–59, it was stated that the semiconductor body 11 could be removed until the insulating layers formed in the troughs 86 are exposed. As shown in FIG. 60, the removal can continue even through the insulating layer formed in the troughs without any undesirable effects if it is desired to decrease the depth of the islands 27. Conversely, it is not necessary to go down to the insulating layers in the troughs if there is no desire to do so. Thus, as shown in FIG. 61, the lapping or removal operation can stop considerably above the portions of the insulating layers in the troughs. Thereafter, an insulating layer 89 is deposited over the semiconductor body and thereafter windows can be formed in the insulating layer 89. Fences 91 of the type hereinbefore described are diffused into the semiconductor body until they join the insulating layers within the troughs to provide islands 27 which are isolated from each other by the insulating layer 12 in combination with the diffused fences 91. After the fences have been diffused, the oxide layer may be regrown over the windows.

Figure 62:
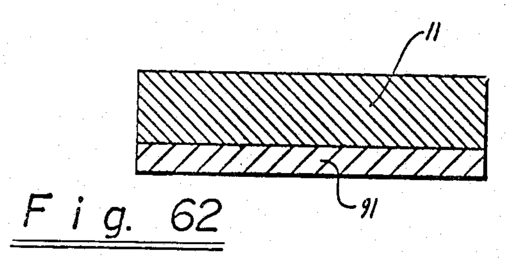
FIGS. 62–65 are cross-sectional views of semiconductor structures and show a method in which epitaxial techniques can be utilized to form a layer of semiconductor material having a conductivity different from the conductivity of the main body of semiconductor material.
Figure 64:
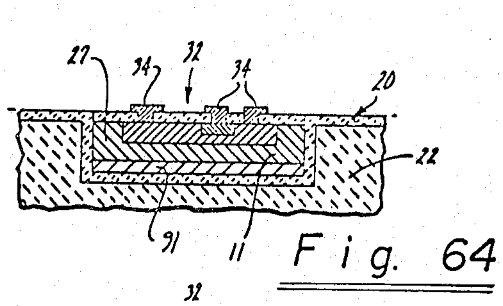
Figure 63:
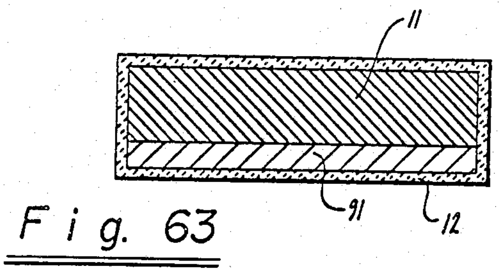

Still another method for forming our semiconductor structure is shown in FIGS. 62–64. In this embodiment, a layer 91 of different conductivity is disposed on the lower surface of the semiconductor body 11. Thus, for example, an *n*+ layer can be disposed on a semiconductor body 11 of the p-type. Thereafter, an insulating layer 12 is formed on the outer portion of the body 11 and the layer 91 as shown in FIG. 63. The semiconductor structure is then formed in much the same manner as shown in FIGS. 4–8 to make possible an active device such as a transistor 32 as shown in FIG. 64 in which the *n*+ layer is disposed at the bottom of the island 27 and adjacent the silicon dioxide insulating layer forming a part of the grid structure 20.

Figure 65:
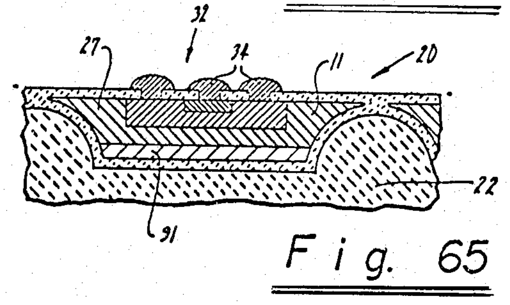

As shown in FIG. 65, the same technique can be utilized with the other types of construction herein disclosed.

Figure 66:
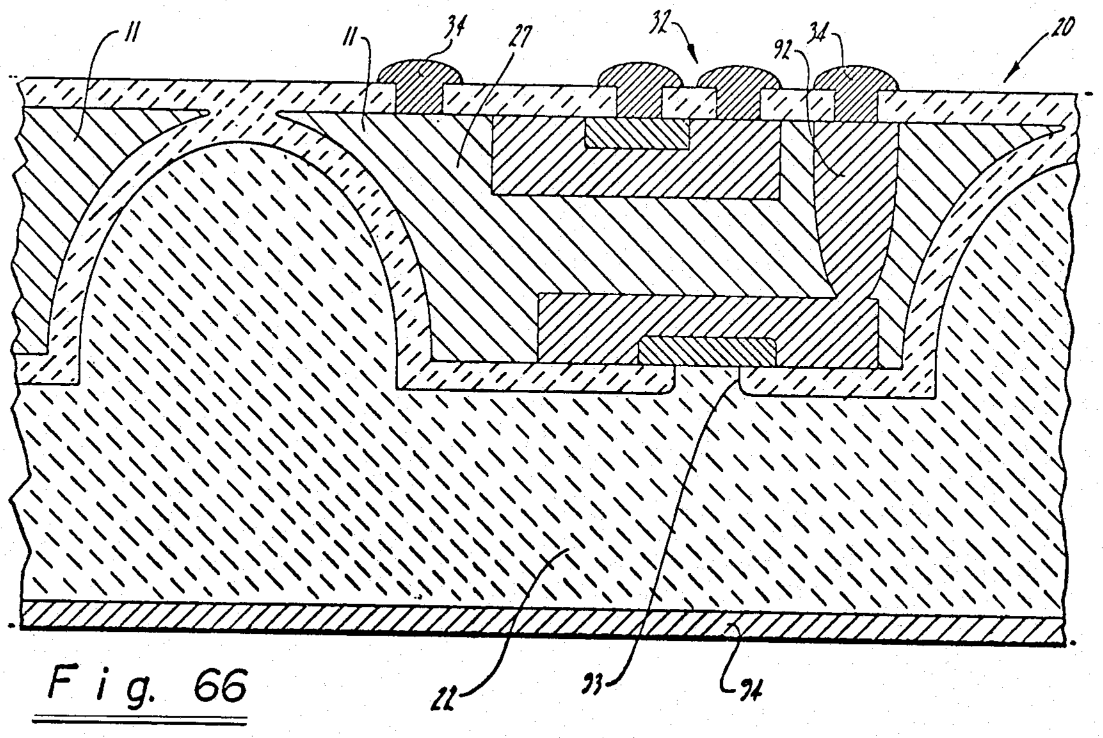
FIG. 66 is a cross-sectional view showing how active and passive devices can be formed in more than one surface of the isolated islands of the semiconductor structures shown in the above identified figures.

In FIG. 66, there is disclosed another embodiment of our semiconductor structure showing that active and passive devices can be formed in both the upper and lower surfaces of a single island 27. To make contact to the lower device 32, a conducting portion 92 is diffused into the body 11 to make contact with the p region of the lower device. The other region of the lower device 32 makes contact with the support structure 22 through a window 93 provided in the grid structure 20. The device is also provided with a metal base 94 to facilitate making contact with the device in the lower portion of the island 27. The significant feature of the semiconductor structure shown in FIG. 66 is that devices can be diffused into both sides of the islands 27. Those at the bottom are diffused by conventional methods after completion of the structure shown in FIG. 3 and in proper positions so that they will appear in the desired islands 27 formed at the later time. Those at the top are diffused in the islands 27 after completion of grid structure 20 and the support structure 22.

Although the foregoing structures and methods have been described as being such that the devices are formed after the grid structure and support structure have been formed, it should be understood that, if desired, the devices can be formed in the semiconductor body prior to the formation of the grid structure and the support structure. Thus, the devices can be formed in a structure such as shown in FIG. 3 and then the support structure and the grid structure grown by the method shown in FIGS. 20–24 so that the grid structure forms isolated islands of the portions of the semiconductor body in which the devices have been grown. Also, it should be understood that although the foregoing description has been directed primarily to silicon, other suitable materials such as germanium can be used.

Figure 67:
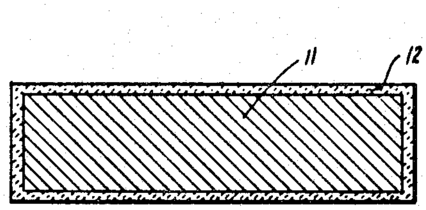
FIGS. 67–74 are cross-sectional views of semiconductor structures and show another method incorporating the present invention for forming our semiconductor structure.
Figure 68:
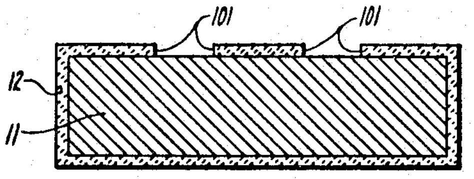
Figure 69:
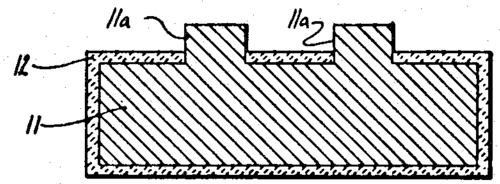

Still another method for making our semiconductor structure is illustrated in FIGS. 67–74. As shown in FIG. 67, a semiconductor body 11 of single crystal or monocrystalline silicon is used which also may be of either *n* or *p* type conductivity. A layer 12 of suitable insulating material such as silicon dioxide is grown on the body as hereinbefore described. Windows 101 are formed in the upper surface of the insulating layer 12 by conventional photoresist techniques so that the upper surface of the monocrystalline body 11 is exposed through the windows as shown in FIG. 68. Thereafter, by epitaxial techniques well known to those skilled in the art, single crystal or monocrystalline silicon is grown in the windows 101 so that the monocrystalline silicon extends a substantial distance above the windows 101 to provide what may be called mesas or mounds 11*a* having a substantial depth which, in fact, form a continuation of the monocrystalline body 11, as shown in FIG. 69. The monocrystalline silicon mounds or mesas 11*a* are grown to a suitable height as, for example, 10 to 25 microns. This operation is carried on at conventional temperatures as, for example, between 1100° and 1200° C. for a period of approximately 30 to 45 minutes. For reasons well known to those skilled in the art, the monocrystalline silicon will not deposit upon the silicon dioxide insulating layer 12 so that the preferential growth takes place in the windows to form the mounds 11*a*.

Figure 70:
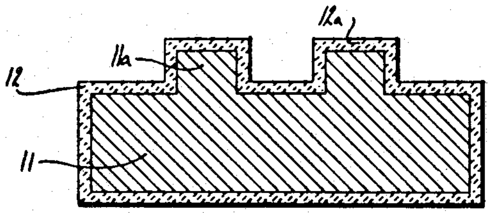

After the mounds 11*a* have been grown to the suitable height, the entire structure is again placed in an oxidizing atmosphere at an elevated temperature to form insulating layers 12*a* over the mounds 11*a* which join with the insulating layer 12 so that the entire structure is covered with an insulating layer of silicon dioxide as shown in FIG. 70.

Figure 71:
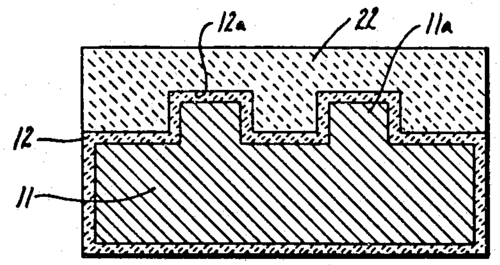

Thereafter, the upper surface of the insulating layer 12 and the insulating layers 12*a* are treated as hereinbefore described and polycrystalline silicon is deposited upon the silicon dioxide insulating layer to provide a support structure 22 as shown in FIG. 71. As can be seen, this structure which is shown in FIG. 71 has an appearance which is substantially identical to the structure which is shown in FIG. 17. Thereafter, the structure can be subjected to the steps hereinafter described to provide the desired semiconductor structure.

Figure 72:
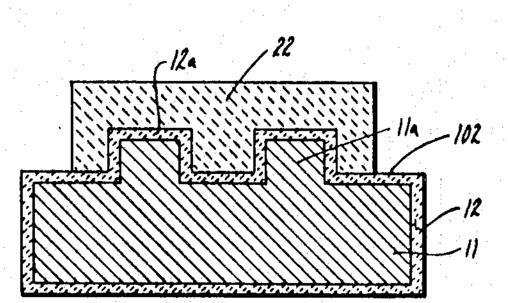
Figure 73:
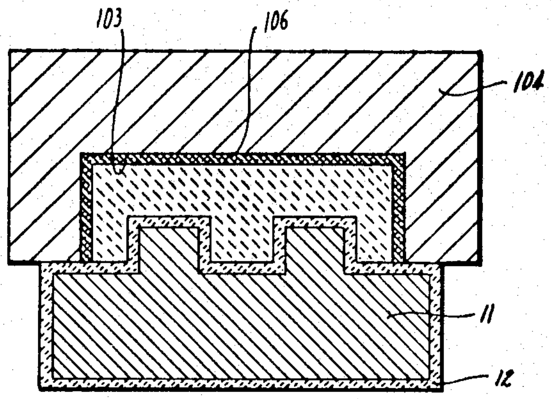
Figure 74:
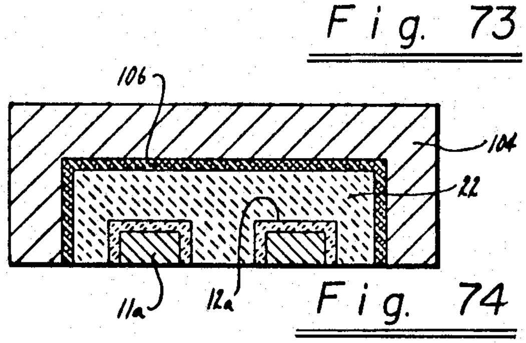

In FIGS. 72, 73 and 74, additional steps are shown in which the semiconductor structure shown in FIG. 71 can be handled to provide the desired semiconductor structure. Thus, in FIG. 72, a lip 102 has been formed on the edge of the semiconductor structure as shown in FIG. 72 by suitable photolithographic techniques utilizing a chemical etch which preferentially attacks the silicon but fails to attack the silicon dioxide insulating layer 12. In this way, the silicon dioxide layer 12 acts as a stop for the chemical etch.

After the lip 102 has been formed, the entire semiconductor structure is inserted into a recess 103 formed in a metal block 104 which is mounted on a lapping wheel of a conventional lapping machine. The semiconductor structure is retained within the recess by suitable means such as a wax 106. Thereafter, the lapping machine is utilized to remove the lower portion of the insulating layer 12 and to remove the entire parent monocrystalline body 11 so that all that remains are the mounds 11*a* which are in the form of islands insulated from each other by the insulating layers 12 and 12*a* within the polycrystalline body 22 which serves as the support structure. Thereafter, the semiconductor structure can be removed from the metal block 104 and semiconductor devices such as transistors, diodes and the like can be formed in the insulated islands 11*a*.

It should be appreciated that the foregoing descriptions, in order to simplify the description thereof, have been limited to a single chip. However, it should be appreciated that in conventional production techniques that a relatively large wafer is utilized from which hundreds of chips are formed of the type shown in the drawings.

It has been found that the procedure set forth in conjunction with FIGS. 67–71 is advantageous in that it has been found that there is less lateral growth than there is lateral etching and, therefore, it is possible to obtain a higher density of components. For example, with the technique described in FIGS. 67–71, it is possible to have transistors which are separated by no more than 20 microns from each other.

Figure 75:
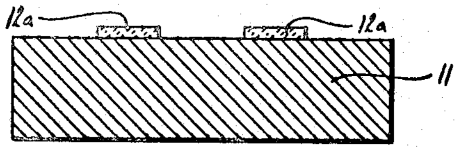
FIGS. 75–80 are cross-sectional views of semiconductor structures and show another method incorporating the present invention for forming our semiconductor structure.
Figure 76:
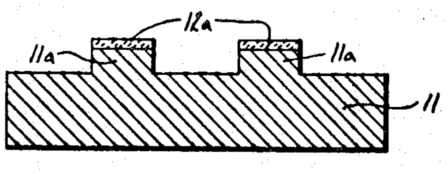

A still further method for making our semiconductor structure is shown in FIGS. 75–80. As described in conjunction with previous embodiments, the operation in performing our method is commenced by utilizing a semiconductor body 11 of single or monocrystalline silicon which may be of either *n* or *p* type conductivity. A layer 12 of suitable insulating material such as silicon dioxide is formed on the body as hereinbefore described to provide a structure such as shown in FIG. 67. Thereafter, by conventional photolithographic techniques and chemical etching, all of the insulating layer 12 is removed except for small portions 12*a* as shown in FIG. 75.

After this has been completed, the structure shown in FIG. 75 is placed in a chemical etch which selectively attacks the exposed monocrystalline silicon of which the body 1 is formed but which does not attack the insulating layer 12 formed of silicon dioxide or the monocrystalline silicon immediately below. This step is continued until mounds or mesas 11*a* are formed of a suitable depth below the insulating layers 12*a*. Thereafter, the entire structure is re-oxidized in a conventional manner to reform a layer of insulating material 12 which completely surrounds the monocrystalline body 11 and the mesas or mounds 11*a*.

Figure 77:
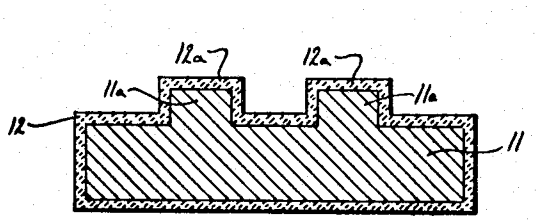
Figure 78:
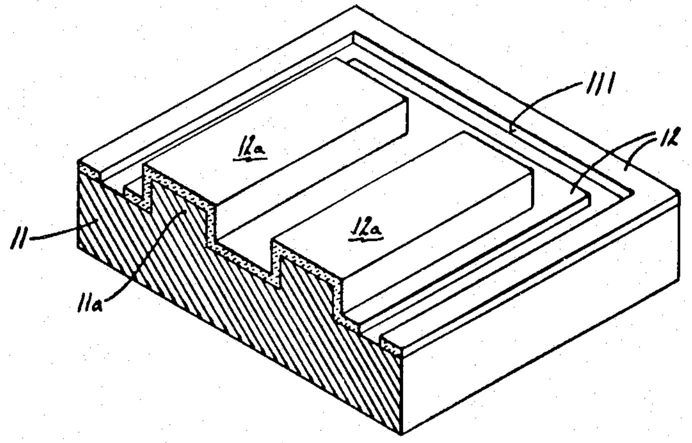

After the insulating layer 12 has been formed as shown in FIG. 77, a grid 111 is formed around each of the areas in which a semiconductor device or circuit is to be formed. Thus, as shown in FIG. 78, a rectangular grid 111 has been formed which surrounds the mesas. This grid is formed by the use of suitable photolithographic techniques and by utilizing a chemical etch which attacks the insulating layer formed of silicon dioxide which is exposed through the photoresist pattern to provide a rectangular groove 111 which extends down to the monocrystalline body 11. At the time the groove 111 is formed, the insulating layer covering the sides and bottom of the body 11 is removed as shown in FIG. 78.

After the grid bars or recesses 111 have been formed, the surface of the insulating layer is prepared as hereinbefore described and a polycrystalline material is grown onto the treated surface to provide a support structure 22. As can be seen from FIG. 79, the epitaxial growth also takes place within the rectangular grid recess 111 and makes intimate contact with the monocrystalline body 11 through the grid recess. It has been found that the material deposited epitaxially within the grid recess 111 actually commences its growth as a monocrystalline material and, therefore, makes intimate contact with the monocrystalline body 111. Thereafter, as the crystalline growth is continued, the growth changes to a polycrystalline structure similar to the polycrystalline structure which is grown over the remainder of the insulating layer 12.

Figure 79:
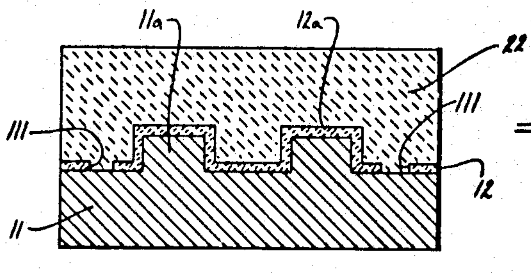
Figure 80:
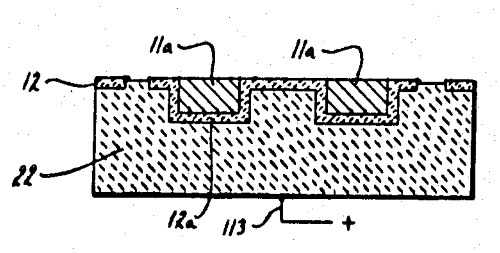

After the support structure 22 has been grown to a suitable depth, the entire structure shown in FIG. 79 is placed in an electrolyte and polished electrochemically to remove the parent portion of the monocrystalline body 11. As shown in FIG. 8, this is accomplished by connecting a lead 113 to the polycrystalline support structure 22 to which a suitable voltage, such as a positive voltage, is connected as shown in FIG. 80. An electrode is placed in the electrolyte and connected to a negative voltage to commence the electrochemical etching. Electrical contact is made between the electrolyte and the positive lead 113 through the polycrystalline material 22 and the material which is deposited in the grid recess 111 and which makes intimate contact with the monocrystalline body 11 connected to lead 113.

In a manner well known to those skilled in the art, the body 11 is etched away. This etching continues until all of the body 11 has been removed flush with the insulating layer 12. As soon as the etching has continued sufficiently far so that the insulating layer 12 is exposed and the material 22 is etched away down into the grid recess 111, contact with the portions 11*a* is broken. Therefore, even though etching may still continue to take place within the grid recess 111, etching will be stopped in the portions 11*a* so that they will remain flush with the top of the insulating layer 12 to form islands which are isolated from each other and from the remainder of the semiconductor structure by the insulating layer 12. Thereafter, within a convenient time, electrochemical etching is stopped. This timing is not critical because it does not matter is a small amount of the material within the grid recess 111 is etched away. Thus, it can be seen that a very precise electrochemical polishing takes place with this method to remove the parent monocrystalline body 11 overlying the insulating layer 12.

Thereafter, the structure is treated as hereinbefore described to grow active and passive semiconductor devices within the islands 11*a*.

We claim:

1. A semiconductor body comprising: a first layer of semiconductor material of a first conductivity type having an upper and a lower surface; a substantially planar second layer adjacent and adherent to the upper surface of said first layer, said second layer comprising a material that protects said upper surface from unwanted contamination; a third layer of supporting material adjacent and adherent to the exposed portion of said second layer, said third layer material capable of being easily removed by a substance that will not affect said second layer; a fourth layer adjacent and adherent to the lower surface of said first layer and formed to separate said first layer into a plurality of separate and distinct regions, said fourth layer comprising a material that provides electrical insulation along the adjacent first layer lower surface; a fifth layer adjacent and adherent to the exposed portion of said fourth layer and comprising a supporting material, whereby integrated circuits may readily be formed by removing said third layer of supporting material and processing the remaining portion of the wafer.

2. The body recited in claim 1 wherein said first layer of semiconductor material comprises silicon, and said second and fourth layer materials respectively comprise an oxide of silicon.

3. The body recited in claim 1 wherein said first layer semiconductor material is monocrystalline and said third and fifth layers comprise respectively a semiconductor material.

4. The body recited in claim 3 wherein said first layer of semiconductor material comprises monocrystalline silicon, said second and fourth layers comprise respectively silicon dioxide, and said third and fifth layers comprise respectively polycrystaline silicon.

5. The body recited in claim 4 wherein the oxide of silicon in said second layer is suitable for masking.

6. The body recited in claim 5 wherein said fourth layer extends substantially through said first layer to said second layer.

7. The body recited in claim 6 wherein said first layer comprises at least two regions, with one region having a higher impurity concentration than the other.

* * * * *